(12) United States Patent
Nemati et al.

(10) Patent No.: US 7,961,540 B2
(45) Date of Patent: *Jun. 14, 2011

(54) DYNAMIC DATA RESTORE IN THYRISTOR-BASED MEMORY DEVICE

(75) Inventors: Farid Nemati, Menlo Park, CA (US); Hyun-Jin Cho, Palo Alto, CA (US); Robert Homan Igehy, Los Altos, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/182,128

(22) Filed: Jul. 29, 2008

(65) Prior Publication Data

US 2010/0315871 A1    Dec. 16, 2010

Related U.S. Application Data

(63) Continuation of application No. 11/361,334, filed on Feb. 24, 2006, now Pat. No. 7,405,963, which is a continuation of application No. 11/112,090, filed on Apr. 22, 2005, now Pat. No. 7,042,759, which is a continuation of application No. 10/472,737, filed as application No. PCT/US02/10706 on Apr. 5, 2002, now Pat. No. 6,885,581.

(60) Provisional application No. 60/281,893, filed on Apr. 5, 2001.

(51) Int. Cl.
*G11C 11/00* (2006.01)

(52) U.S. Cl. ......... 365/222; 365/71; 365/100; 365/148; 365/174; 365/159; 257/133; 257/137

(58) Field of Classification Search .................. 365/222, 365/159, 71, 100, 148, 174
See application file for complete search history.

(56) References Cited

U.S. PATENT DOCUMENTS

| | | | |
|---|---|---|---|
| 4,031,412 A | 6/1977 | Ohhinata et al. | |
| 4,604,728 A | 8/1986 | Okajima | |
| 4,829,357 A | 5/1989 | Kasahara | |
| 4,864,168 A | 9/1989 | Kasahara et al. | |
| 5,099,300 A | 3/1992 | Baliga | |
| 5,379,174 A | 1/1995 | Kasamoto | |
| 5,412,598 A | 5/1995 | Shulman | |
| 6,229,161 B1 * | 5/2001 | Nemati et al. | 257/133 |
| 6,462,359 B1 | 10/2002 | Nemati et al. | |
| 6,653,175 B1 | 11/2003 | Nemati et al. | |
| 6,690,038 B1 * | 2/2004 | Cho et al. | 257/133 |
| 6,690,039 B1 * | 2/2004 | Nemati et al. | 257/133 |
| 6,727,528 B1 | 4/2004 | Robins et al. | |
| 6,781,907 B2 * | 8/2004 | Marr | 365/211 |

(Continued)

*Primary Examiner* — Viet Q Nguyen
(74) *Attorney, Agent, or Firm* — The Webostad Firm

(57) ABSTRACT

A dynamically-operating restoration circuit is used to apply a voltage or current restore pulse signal to thyristor-based memory cells and therein restore data in the cell using the internal positive feedback loop of the thyristor. In one example implementation, the internal positive feedback loop in the thyristor is used to restore the conducting state of a device after the thyristor current drops below the holding current. A pulse and/or periodic waveform are defined and applied to ensure that the thyristor is not released from its conducting state. The time average of the periodic restore current in the thyristor may be lower than the holding current threshold. While not necessarily limited to memory cells that are thyristor-based, various embodiments of the invention have been found to be the particularly useful for high-speed, low-power memory cells in which a thin capacitively-coupled thyristor is used to provide a bi-stable storage element.

2 Claims, 3 Drawing Sheets

U.S. PATENT DOCUMENTS

| | | |
|---|---|---|
| 6,790,713 B1 | 9/2004 | Horch |
| 6,845,026 B1 * | 1/2005 | Gharia ..................... 365/49.1 |
| 6,885,581 B2 * | 4/2005 | Nemati et al. ............. 365/159 |
| 6,944,051 B1 * | 9/2005 | Lee et al. .................. 365/159 |
| 7,042,759 B2 * | 5/2006 | Nemati et al. ............. 365/159 |
| 7,242,607 B2 * | 7/2007 | Kim ........................... 365/149 |
| 7,245,525 B1 * | 7/2007 | Lee et al. .................. 365/159 |
| 7,405,964 B2 * | 7/2008 | Philipp et al. ............. 365/163 |
| 2002/0089024 A1 | 7/2002 | Iwata |
| 2003/0218494 A1 | 11/2003 | Kubo et al. |

\* cited by examiner

US 7,961,540 B2

DYNAMIC DATA RESTORE IN THYRISTOR-BASED MEMORY DEVICE

RELATED APPLICATIONS

This is a continuation of U.S. patent application Ser. No. 11/361,334, filed on Feb. 24, 2006, now U.S. Pat. No. 7,405,963, which is a continuation of U.S. patent application Ser. No. 11/112,090, filed on Apr. 22, 2005, now U.S. Pat. No. 7,042,759, which is a continuation of U.S. patent application Ser. No. 10/472,737, filed on Sep. 22, 2003, now U.S. Pat. No. 6,885,581, issued on Apr. 26, 2005, which is a national under 35 USC §371 of PCT/US02/10706, filed on Apr. 5, 2002, which claims priority and benefit to U.S. Provisional Patent Application Ser. No. 60/281,893, filed on Apr. 5, 2001, to which priority is claimed under 35 U.S.C. §120 for common subject matter, each of which is incorporated by reference.

This application relates to U.S. patent applications Ser. No. 09/814,980, filed on Mar. 22, 2001, now U.S. Pat. No. 6,462,359, issued on Oct. 8, 2002; and Ser. No. 09/815,213, filed on Mar. 22, 2001, now U.S. Pat. No. 6,727,528, issued on Apr. 27, 2004, both of which are incorporated by reference.

FIELD OF THE INVENTION

The present invention is directed to semiconductor devices and, more specifically, to semiconductor memory devices. The present invention has been found to be particularly advantageous for memory devices including thyristor-based memory cells.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors, or 6 transistors, which result in much lower density, with typical cell size being between about 60 $F^2$ and 150 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in providing a bi-stable element for such memory cells and in overcoming many previously unresolved problems for thyristor-based memory applications. This type of NDR device has a control port that is capacitively coupled to a relatively-thin thyristor body. The thyristor body is sufficiently thin to permit modulation of the potential of the thyristor body in response to selected signals capacitively coupled via the control port. Such capacitively-coupled signals are used to enhance switching of the thyristor-based device between current-blocking and current-conducting states.

An important consideration in the design of thyristor-based memory cells, including the above thyristor-based type, concerns maintenance of the thyristor's conducting state. When the thyristor is in the forward conducting state, a DC current larger than the holding current of the thyristor flows through the thyristor in order to maintain the conducting state. For the specific case of the above thyristor-based type memory cell, optimal operation of the device is challenged by various issues. For example, when a MOSFET access transistor is used to control the current flow through a thyristor, variations in the threshold voltage of access transistors from cell to cell in a large array and the exponential current-voltage dependence for access transistors in the sub-threshold regime can result in an unduly large standby current for the array and/or loss of the conducting state for some of the thyristors in the array. In addition, unduly large standby resistors often can be used in each memory cell. This resistor can add to the bit-cost of the memory by adding some extra steps to the fabrication process and potentially increasing the memory cell size. Furthermore, the resistance variation of the standby resistor used from cell to cell can result in a large standby current for the array and/or loss of the conducting state for some of the thyristors in the array. Other related challenges include variations in bit-line voltage during read and write operations into one cell and a resultant large standby current and/or loss of the conducting state for the other cells sharing the same bit line.

SUMMARY

The present invention is directed to overcoming the above-mentioned challenges and others related to the types of devices discussed in the above-indicated related applications and in other memory cells. For more specific examples of these devices to which the present invention is applicable, reference may be made to each of the above-mentioned patent documents and to the publication cited therein and in the priority patent document, each of which is incorporated by reference in its entirety.

Generally, the present invention is directed to dynamic data restoration in a memory device having an array of memory cells and with each memory cell having an internal positive feedback loop. A restore current or voltage pulse is applied to each memory cell for a short interval. The pulses can be applied periodically with each applied pulse defined to restore a forward conducting state of an element in the memory cell in response to the internal positive feedback loop.

According to one aspect, the present invention is directed to a method for dynamically restoring data in a thyristor-based memory device, such as a memory cell array, having a plurality of thyristor-based memory cells. In each memory cell, a thyristor with an internal positive feedback loop is used to provide the storage element. The method includes applying a current or voltage restore pulse for a short interval to each memory cell and therein restoring data in the cell using the internal positive feedback loop of the thyristor.

According to an example embodiment of the present invention, a restoration circuit is used to apply a voltage or current pulse or waveform to the thyristor of a thyristor-based memory cell and therein restore data in the cell using the internal positive feedback loop of the thyristor. In one implementation, the internal positive feedback loop in the thyristor is used to restore the conducting state of a device after the thyristor current drops below the holding current. The pulse waveform and frequency are defined to ensure that the transistor is not released from its conducting state. This restoration is typically applied after the thyristor device is fully in the forward conducting state and in a manner that prevents the thyristor device from transitioning completely out of the forward conducting state.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
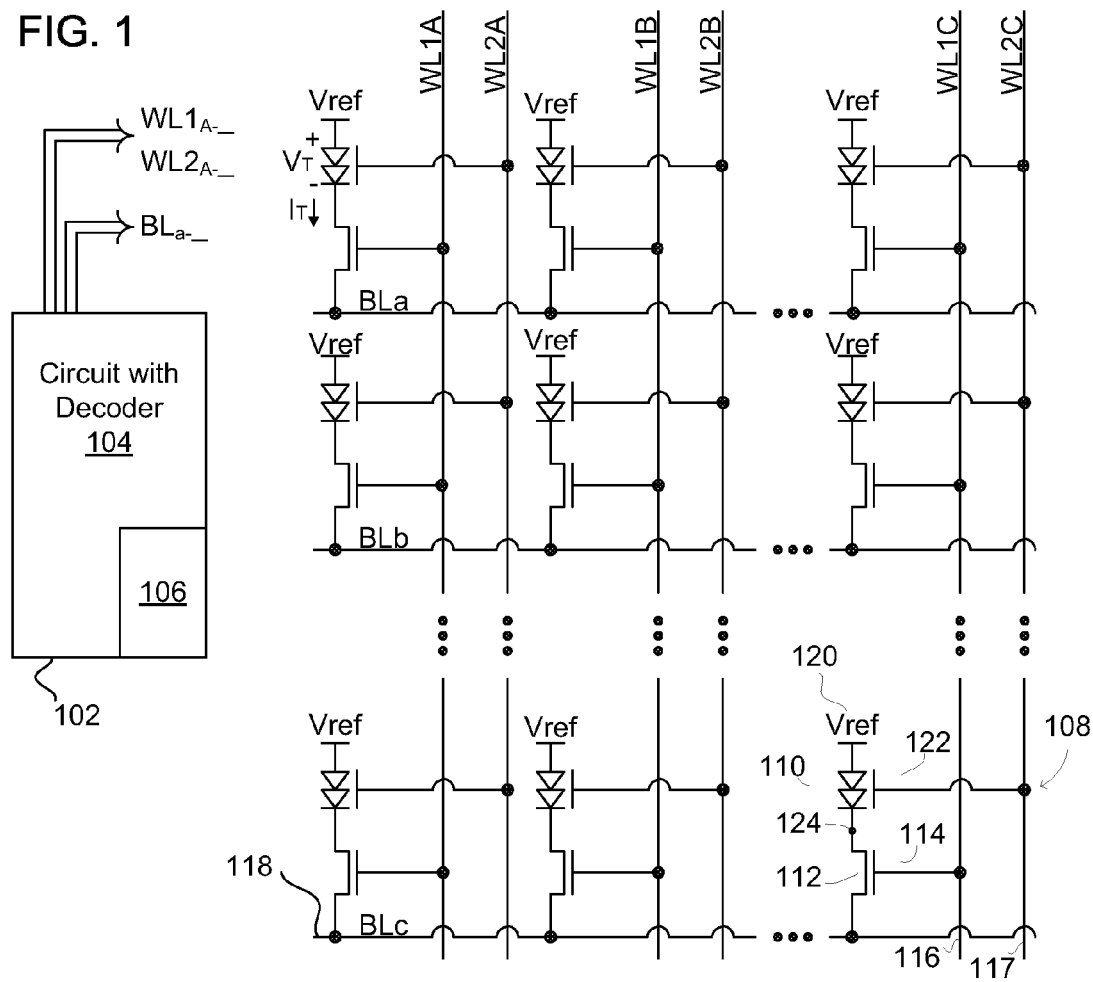
FIG. 1 shows a semiconductor device including an array of thyristor-based memory cells, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to different types of memory devices, and has been found to be particularly useful for such devices using high-speed, low-power, thyristor-based memory cells. While the present invention is not necessarily limited to such devices, various aspects of the invention may be appreciated through a discussion of various examples using this context.

According to an example embodiment of the present invention, a dynamic standby current is used to restore the forward conducting state of a thyristor device. This restoration is after the thyristor device is fully in the forward conducting state and before the thyristor device transitions into the current blocking state. In this context, it has been discovered that the forward conducting state of a thyristor device can be restored (i.e., maintained or reinstated) using the internal positive feedback loop in the thyristor. The junctions of the thyristor in the forward conducting state are saturated with minority carriers, and it takes a relatively long time for all the minority carriers to recombine, once the thyristor current is cut off. In one example implementation, the internal positive feedback loop in the thyristor (for example, by two back-to-back connected PNP and NPN bipolar transistors, as in FIGS. 3a and 3b in U.S. Pat. No. 6,229,161), is used to restore the conducting state of the thyristor after its current is cut off. The current waveform is periodically pulsed for the thyristor and the forward conducting state of the thyristor is maintained in the steady state.

FIG. 1 shows an array of thyristor-based memory cells, such as those discussed above, along with an array-access controller 102, according to a specific example embodiment of the present invention. The array-access controller 102 includes a decoder 104 for decoding bit lines and word lines used to address and access the memory cells. As will be discussed further below, the array-access controller 102 also includes a restoration circuit 106 that is used to help maintain or reinstate a forward conducting state.

Each cell, a representative one of which is depicted as 108, includes a PNPN-type NDR device, shown as thyristor 110, and a storage-node access circuit that is exemplified by a MOS-type pass (or access) transistor 112. The transistor 112 includes a gate 114 that forms part of a first word line (WL1) 116, and is used to provide electrical coupling between a bit line (BL) 118 and a data storage node 124 for the cell 108. Thus, the lower one of the drain and source regions of the transistor 112 is connected to BL 118. At the top of the device 110 is a node 120 that is commonly shared by each cell for connecting the top terminal of the device to a supply or reference voltage, Vref. Fabrication of each cell and its components can be implemented using any of various alternative approaches; for example, the device 110 in each cell can be made: over a portion of the access transistor; over the source or drain that is not connected to the bit line; adjacent to the access transistor; in a silicon-on-insulator (SOI) application; in more traditional silicon substrate (non-SOI) application; and in other forms such as those described in the above-referenced patent documents.

In each cell of the array, the device 110 has a middle region that is adjacent to a charge plate, depicted as gate 122. The gate 122 forms part of a second word line (WL2) 117 and is used to enhance switching between the cell's two stable states: the OFF state, where the device 110 is in a current-blocking mode; and the ON state, where the device 110 is in a current-passing mode. These two states are used to control the storage node 124, shown interconnecting the lower terminal of the device 110 with the upper source/drain region of the transistor 112. The voltage of the storage node 124 is at its high value for the ON state.

Generally, as described in the above-mentioned U.S. patent, typical operation of the cell 108 involves using the array-access controller 102 to provide appropriate control over the bit line and word lines connecting to the cell 108. For example, in standby mode, the word lines and the bit line are inactive or at their low voltage levels (which can be different for each line). For a write "Zero" operation, BL 118 is raised to its high level and WL1 116 becomes active. This charges the level at the storage node 124 to a high voltage level and moves the device 110 out of the strong forward biased region. A pulse is then applied to WL2 117. Capacitive coupling from WL2 117 to the adjacent body region of the thyristor device 110, e.g., where the adjacent body region is the middle P-doped region of the PNPN thyristor, results in an outflow of the minority charges from the middle P-doped region of the PNPN on the falling edge of the WL2 pulse and blocks the current pass. The device 110 is sufficiently thin so that the gate 122 has tight control on the potential of the body region, and can modulate this potential by the capacitive coupling. The device 110 is switched to the blocking state after this operation.

For a write "One" operation, the voltage level of BL 118 is held low. After WL1 116 is raised to its high level, a pulse is applied to WL2 117. The rising edge of this pulse raises the potential of the P region by capacitive coupling and makes the NP and lower PN junctions forward biased which, in-turn, starts the well-known regenerative process in the PNPN thyristor construction and the device 110 transitions to its forward conducting state. After completing such an operation, control over the bit and word lines typically changes to effect the standby mode in which a current path through the transistor 112 is blocked.

As mentioned above, the array-access controller 102 also includes a restoration circuit 106 that is used to help maintain or reinstate the forward conducting state for a thyristor-based RAM cell, such as with the above example of FIG. 1, after current passing through the thyristor device is removed. The restoration circuit 106 and the array-access controller 102 provide the bit-line and word-line control to each cell of the array as necessary for adequate standby current to restore the regenerative positive feedback effect in the thyristor.

In the example case of the specific cell array of FIG. 1, this control can be readily implemented in a variety of different ways. For example, in one such implementation, the pass (or access) transistor 112 of FIG. 1 is periodically turned on for a short time interval to allow current into the bit line, which is kept at its standby low level. The access transistor can then be completely shut off until the next period. If the thyristor is holding a "Zero", i.e., if the thyristor is in the forward blocking state, the periodic turn-on of the access transistor does not flow any current. If the thyristor is holding a "One", i.e., if the thyristor is in the forward conducting state, the periodic turn-on of the access transistor results in a rather large voltage drop (~0.6V) across one of the base-emitters of the thyristor, which restarts the regenerative positive feedback effect in the thyristor and flows current into the bit line for a short time interval that restores the "One" state. As mentioned above, the time average of this current over a period can even be smaller than the $I_H$ of the thyristor to maintain the conducting state. Using this approach, data stored in the thyristor-based RAM cell (either "One" or "Zero") is maintained in the steady state while the average standby current of the cell can be smaller than the holding current of the thyristor.

The periodic turn-on of the access transistor can be controlled either by periodically pulsing WL1 or by periodically pulsing BL. By dynamically controlling the standby current, the sensitivity of the standby current of the cell to threshold voltage variations of the access transistor, variations in $I_{hold}$ of the thyristor and bit-line disturbs during the read and write operations for the adjacent cells is reduced or completely eliminated because the access transistor can be completely shut off when the cell is in the idle mode (meaning that there is no read, write, or dynamic standby current for the cell and WL1 is not active).

Various implementations of the dynamic standby current control in a thyristor-based memory can be used to address challenges to memory applications, such as DRAM applications, including those discussed above. For example, the contents of the thyristor-based memory are not necessarily required to be sensed to restore the conducting state of the cell after a restore operation, and the charge restoration is very fast. In addition, multiple cells per each bit line can be restored at the same time and the standby current control pulses in a thyristor-based memory can be effected within the array cycle time. In case of DRAM, the dynamic refresh operation does involve a sense circuit. Also, in such implementations, typically only one cell per bit line is sensed in the memory circuit at a given time.

Figure 2:
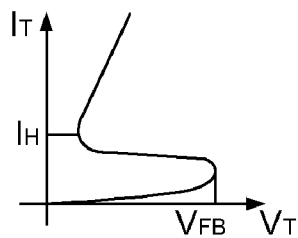
FIG. 2 shows the I-V characteristics of a thyristor and two parameters of the thyristor used in connection with an example embodiment of the present invention.

In connection with the present invention, it has also been discovered that the forward conducting state of a thyristor device can be restored using a current waveform that has an average amplitude over a given time that may or may not be larger than the current otherwise needed to "hold" the thyristor in the forward conducting state; also known as the "holding current" for the thyristor ("$I_H$"). FIG. 2 shows the I-V characteristics of a thyristor and two parameters of the thyristor, which are forward break-over voltage ($V_{FB}$) and holding current ($I_H$), for use in connection with another example embodiment of the present invention.

Figure 3A:
FIG. 3A shows an example arbitrary periodic current waveform for restoring the conducting state of a thyristor, according to the present invention.

FIG. 3A shows an example periodic current waveform for the thyristor whose time average is either smaller, equal, or larger than $I_H$; thus, various alternative implementations of the present invention generate and apply such a periodic waveform for the thyristor with the waveform having a time average that is either smaller, equal, and larger than $I_H$. In this context, the relationship between the time average and the holding current (threshold) is as follows:

$$\frac{1}{T}\oint_T I_T(t)\cdot dt \leq \ \geq I_H$$

The example current waveform shown in FIG. 3A is selected to maintain the conducting state of the thyristor.

Figure 3B:
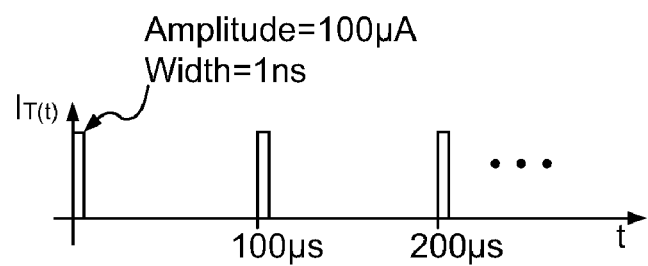
FIG. 3B shows an example standby current waveform adapted to maintain the conducting state of a thyristor, also according to the present invention.

FIG. 3B shows a standby current waveform that is generated and applied to maintain the conducting state of a thyristor, according to another example embodiment of the present invention. In this example, a periodic current waveform is generated and applied to flow 100 μA for 1 ns through the thyristor; the waveform has a period of 100 μs or less is capable of maintaining the conducting state of the thyristor.

In another example embodiment, the frequency and the amplitude of the standby current pulses in a thyristor-based memory are adaptively controlled to track the variations of some device properties. For example, variations in the holding current of the thyristors or the leakage current of the access transistors can be tracked with temperature. These variations can be tracked, for example, from wafer to wafer, die to die, and even separately for different blocks of memory on the same die.

Figure 4:
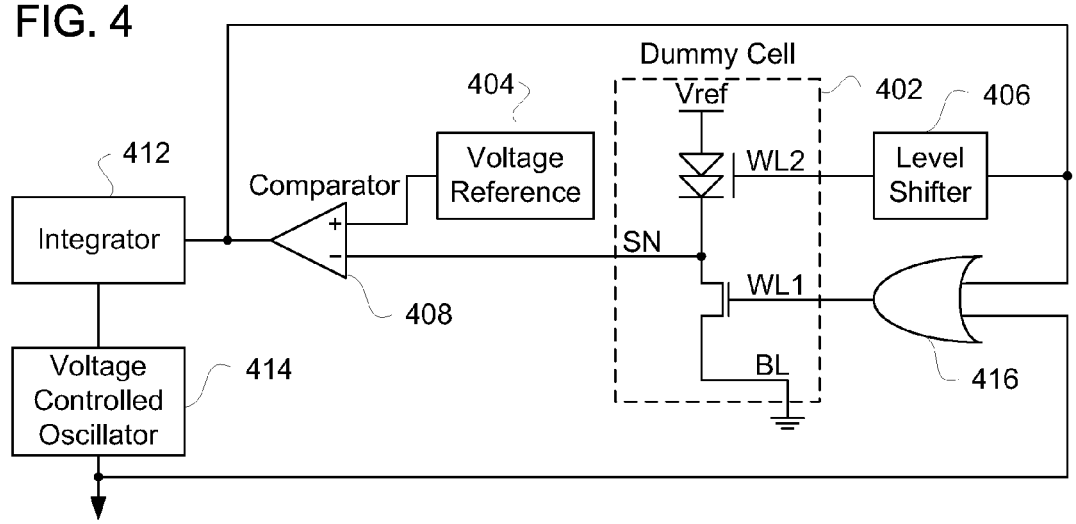
FIG. 4 is a block diagram of a control circuit for a thyristor-based memory cell, according to another example embodiment of the present invention.

FIG. 4 shows a block diagram of a circuit adapted to adjust the frequency and/or amplitude of a thyristor based memory cell and to track one or more specific variations in the holding current threshold of a representative (e.g., "dummy" or spare) cell 402 in the memory device (which contains the array of memory cells), according to another example embodiment of the present invention. In a more specific implementation of FIG. 4, the specific variation is temperature, and the representative cell 402 is located in close proximity to the cells that it represents.

For such implementations, if the representative cell 402 were to fail in maintaining its thyristor in its conducting state after the current is removed, the voltage of its storage node (SN) would gradually drop to a level below the level generated by the voltage reference circuit 404 (which also feeds Vref at the top terminal of the thyristor). For example, if this level were to gradually drop from about 0.8V to about 0V, this drop would result in the output of the comparator 408 going high and, via feedback per a level-shifting circuit 406, in a "One" being written back to the representative cell 402. In turn, this action would raise SN and again lower the output of the comparator 408.

The pulse generated at the output of the comparator 408 is integrated at integrator 412 to create a quasi-DC voltage that is used to control the frequency of the periodic standby current pulses. In this illustrated example, the integrator 412 outputs a control signal used to control a modulation circuit 414, such as a voltage-controlled oscillator (VCO), which provides the frequency of the periodic standby current pulses.

These periodic standby current pulses are fed back to access (or pass) transistor within the representative cell 402 via logical "OR" gate 416. Alternatively, the modulation circuit 414 is an amplitude modulator or a pulse-width modulator that controls the amplitude and/or width of the current pulses for the restoration associated with the representative cell 402.

By using a circuit, such as the circuit shown in FIG. 4, as part of or in addition to an array-access controller, such as the array-access controller 102 shown in FIG. 1, a restore pulse and/or a waveform including the restore pulse is readily defined to provide the above-discussed standby current.

Figure 5:
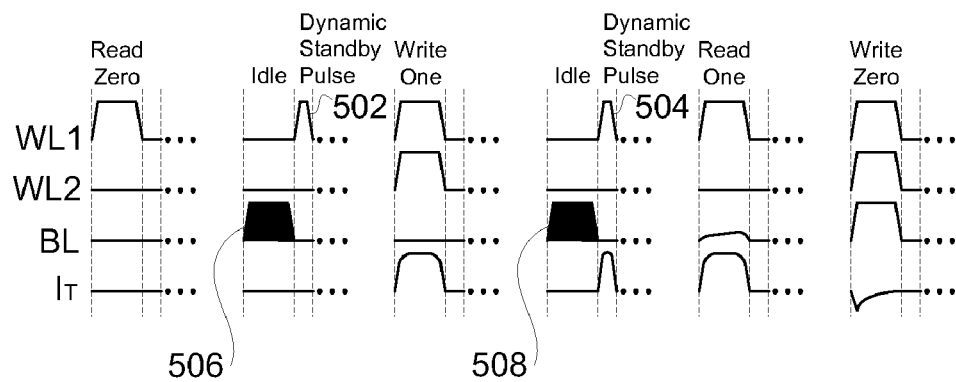
FIGS. 5 and 6 are timing diagrams, each timing diagram respectively showing operations of a thyristor-based memory device using a dynamic standby current scheme, according to two respective example embodiments of the present invention.

FIG. 5 shows the operation of a thyristor-based memory device using a dynamic standby current scheme, according to another example embodiment of the present invention. The timing of the standby current cycles is effected, for example, by pulsing a number of cells per each bit line and/or word line for a short time at the end of every read or write cycle. Two of these post-memory-access pulses are respectively depicted as 502 and 504 in FIG. 5.

More specifically, FIG. 5 shows example waveforms for WL1, WL2, BL, and the thyristor current ($I_T$) for a typical cell during different Read, Write, Idle and Standby operations. Each cycle is divided into two sub-cycles, an access (read/ write) sub-cycle and a restore sub-cycle. During the restore sub-cycle, BL is always at its standby level and WL1 periodically receives a pulse to restore the thyristor's state; for example, WL1 is periodically pulsed about every 100 seconds. In this example, the cell is Idle when it is not being accessed. During the Idle operation, another cell sharing the same bit line can be accessed for a Read or Write operation during that sub-cycle (thus, the undefined-time regions 506 and 508 along BL in FIG. 5).

Figure 6:
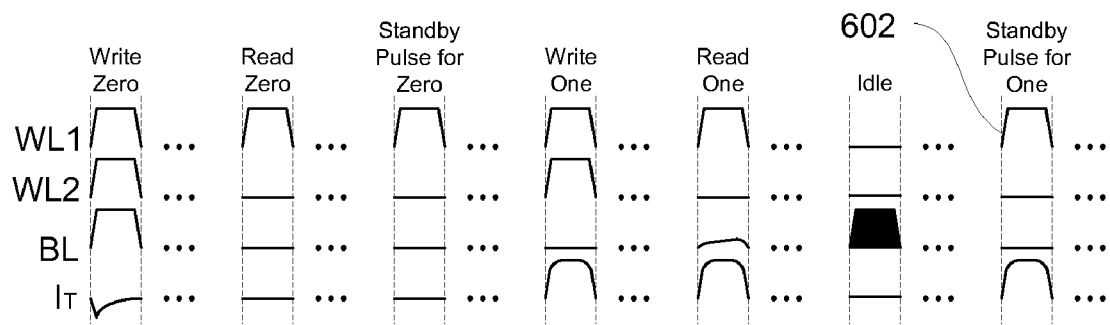

Consistent with another example embodiment of the present invention, FIG. 6 shows a manner in which to effect the timing of the standby current. As with FIG. 5, example waveforms are represented by WL1, WL2, BL, and the thyristor current ($I_T$) for a typical cell during different Read, Write, Idle and Standby operations. In this instance, a full cycle is dedicated for provision of the standby current pulse 602 during which a read or write operation on the standby bit lines is not performed. During the standby cycles, BL is always at its standby level and WL1 is pulsed. In one example implementation, this standby current pulse 602 is applied about every 100 seconds to restore the thyristor's state. In FIG. 6, the cell is "Idle" when the cell is not being accessed; during the Idle operation, another cell sharing the same bit line can be accessed for a Read, Write, or Standby-pulse operation during that cycle.

According to yet another example embodiment of the present invention, the above-described approach of using the internal positive feedback loop of a memory cell for data restoration is applied to memory cells other than thyristor-based memory cells. For example, a memory cell that has an internal positive feedback loop can be restored by periodically applying a dynamic standby current or voltage pulse to the memory cell in a manner not inconsistent with the above-described implementations.

In another implementation, an access cycle to a thyristor-based memory is partitioned to a read/write and restore cycle. In another implementation, a complete memory cycle is partitioned to effect dynamic standby current flow. In another implementation, the period and/or amplitude of the dynamic standby current is pulsed to track variations of the holding current. In still another implementation, the throughput of dynamic standby current restoration of a thyristor-based memory cell array is improved in a manner that includes simultaneously flowing standby current pulses for more than one cell per bit line.

While the present invention has been described with reference to several particular example embodiments, those skilled in the art will recognize that many changes may be made to these example embodiments. For instance, enhancing the standby current as described above in connection with one or more of these example embodiments can be supplemented using another standby current approach, with line control, timing and levels adjusted as may be necessary for proper operation. Further, the skilled artisan will recognize that the "blocked" circuits and generated signals (and/or waveforms) of FIGS. 1 and 4 can be implemented per the levels and timing of a specified application and using a variety of available circuits and/or circuit components, including discrete, semi-programmable and fully-programmable digital and/or analog technologies. These changes do not necessarily depart from the characterization, spirit and/or scope of the present invention, which is set forth in the following claims.

What is claimed is:

1. A semiconductor device comprising:
   a memory cell comprising a thyristor disposed electrically in series with an access device; and
   a restore circuit operable to apply periodic pulses to the memory cell to maintain its data state.

2. The semiconductor device of claim 1, in which the restore circuit is operable to apply the periodic pulses to at least one of the thyristor and the access device.

* * * * *